US007400734B2

(12) United States Patent
Wu

(10) Patent No.: US 7,400,734 B2
(45) Date of Patent: Jul. 15, 2008

(54) METHOD AND APPARATUS FOR EMULATING AUDIO EFFECT

(75) Inventor: Gin-Der Wu, Taipei (TW)

(73) Assignee: ALi Corporation, Taipei (TW)

( * ) Notice: Subject to any disclaimer, the term of this patent is extended or adjusted under 35 U.S.C. 154(b) by 960 days.

(21) Appl. No.: 10/705,851

(22) Filed: Nov. 13, 2003

(65) Prior Publication Data

US 2005/0105742 A1 May 19, 2005

(30) Foreign Application Priority Data

Aug. 26, 2003 (TW) .............................. 92123375 A

(51) Int. Cl.
*H03G 3/00* (2006.01)
*H04R 5/00* (2006.01)
*G10H 1/02* (2006.01)

(52) U.S. Cl. ............................. 381/61; 381/63; 381/17; 381/18; 84/630; 84/707

(58) Field of Classification Search ................... 381/17, 381/18, 61, 63; 84/630, 707
See application file for complete search history.

(56) References Cited

U.S. PATENT DOCUMENTS 5,848,164 A * 12/1998 Levine ........................ 381/61

* cited by examiner

*Primary Examiner*—Vivian Chin
*Assistant Examiner*—George C Monikang
(74) *Attorney, Agent, or Firm*—Troxell Law Office, PLLC

(57) ABSTRACT

The present invention provides an apparatus and a method for emulating audio. The apparatus comprises an echo device, a reverberation device, an audio source device and a first signal synthesizer. Wherein, the echo device receives an audio source signals and applies thereof for generating echo signal and feedback signal; the reverberation device receives the audio source signal and applies thereof in accordance with the feedback signal of the echo device for generating a reverberation signal; the audio source device receives the audio source signal and applies thereof for outputting a direct audio source signal; and the first signal synthesizer is used to receive and synthesize the echo signal, the reverberation signal and the direct audio source signal so as to output a first synthesized signal, which is an audio effect emulation signal.

7 Claims, 3 Drawing Sheets

METHOD AND APPARATUS FOR EMULATING AUDIO EFFECT

BACKGROUND OF THE INVENTION (a). Field of the Invention

The present invention relates to a method and an apparatus for emulating audio effect, more particularly, to a method and an apparatus that applies an architecture capable of using echo, reverberation and direct sound simultaneously.

(b). Description of the Prior Arts

When sound is produced in an enclosed space, multiple reflections will build up and blend together creating so-called "audio effects". For instance, when a short sound impulse is created by a person inside a valley, a reflected sound wave with a lower intensity will bounce back to the person's ear a little later, since the energy of the sound wave will decay during traveling and the walls or other surfaces in the valley will also absorb some of the sound energy while reflecting the sound wave, such that the distinct series of delayed and attenuated sound waves is what we call echoes.

If a continuous sound is created, instead of the short sound impulse, the continuous sound will not only be reflected in the valley, but also the reflected sounds of the continuous sound will superimpose on each other and eventually reach a steady state in very short period of time (about a few seconds). Furthermore, when the continuous sound stops, the reflected sounds can still be heard for a period of time, and the reflected sounds heard by the person during the period of time is what we call reverberation.

Hence, the echoes and the reverberation heard in the valley are the "audio effects" resulting from the sound wave reflecting in the valley.

Following the coming of digital era, audio effects of a sound wave in a certain environment can be emulated by using only a few simple electronic devices. Please refer to FIG. 1, which is a schematic illustration depicting an echo emulation apparatus of prior arts.

As seen in FIG. 1, the echo emulation device 100 is mainly composed of a delay unit 110 and an adder 120. Wherein, an audio source signal 105 emerging at t1 time is transmitted dividedly that one is forwarded directly to the adder 120 and the other is diverted to the delay unit 110 for delaying the signal 105 for a Δt time before it reaches the adder 120, thereafter, the two signals are synthesized using the adder 110 such that an echo signal 130 is outputted from the adder 120. In this regard, the echo signal is the combination of the audio source signal 105 emerging at t1 time and the audio source signal 105 which has been delayed for a Δt period (that is, emerging at t2).

Please refer to FIG. 2, which is a schematic illustration showing a reverberation emulation device of prior arts. As seen in FIG. 2, the reverberation emulation device 200 is composed of a delay unit 110, an adder 120 and a gain unit 205. Wherein, the audio source signal 120 emerging at t1 is first fed into and then outputted from the adder 120, afterward, the signal outputted from the adder 120 is fed back to the adder 120 for synthesizing with the audio source signal 105 after it had been delayed for a Δt period by the delay unit 110 and been decayed by the gain unit 205, thereafter, the adder outputs the synthesized signal, moreover, the process is repetitious for creating a reverberation effect.

In this regard, the final reverberation signal 210 outputted from the reverberation emulation device 200 will be a combination of the audio source signal 105 emerging at time t1 and all the audio source signals 105 which have been successively decayed and delayed by a period of Δt (i.e. at time t2, t3, . . . etc.).

In addition to echo and reverberation, there are many more audio effects that can be simulated using electronic devices of different configurations. However, how to achieve a better and more diversified audio effect using limited funding (i.e. the longer the delay time needed by the audio source signal, the larger the memory will be needed, and consequently, the delay device will be more expensive) and limited available combination of electronic devices are the issues worth considering.

Thus, the present invention comes up with an apparatus and method for emulating audio effects, which is capable of achieving best and most diversified audio effects using efficiently composed electronic devices and limited funding.

SUMMARY OF THE INVENTION

The primary object of the present invention is to provide an apparatus for emulating audio effects that is capable of simulating the performance of a received audio source signal under different environments and outputting the simulated signal. The apparatus comprises an echo device, a reverberation device, an audio source device and a first signal synthesizer. Wherein, the echo device receives audio source signals and applies thereof for generating echo signals and feedback signals; the reverberation device receives the audio source signal and applies thereof in accordance with the feedback signal of the echo device for generating a reverberation signal; the audio source device receives the audio source signal and applies thereof for outputting a direct audio source signal; and the first signal synthesizer is used to receive and synthesize the echo signal, the reverberation signal and the direct audio source signal so as to output a first synthesized signal, which is an audio effect emulation signal.

In a preferred embodiment of the present invention, the echo device further comprises a first delay unit, a second delay unit, a second signal synthesizer, and a third gain unit. Wherein, the first delay unit receives the audio source signal and applies thereof so as to output a first delay signal; the first gain unit receives the first delay signal and applies thereof so as to output a first gain signal; the second delay unit receives the audio source signal and applies thereof so as to output a second delay signal; the second gain unit receives the second delay signal and applies thereof so as to output a second gain signal; the second signal synthesizer is used to receive and synthesize the first gain signal, and the second gain signal so as to output a second synthesized signal which is the feedback signal; and the third gain unit receives the second synthesized signal and applied thereof so as to output a third gain signal, which is the echo signal.

The reverberation device further comprises a third signal synthesizer, a third delay unit, a fourth gain unit and a fifth gain unit. Wherein, the third signal synthesizer is used to receive and synthesize the audio source signal, and the feedback signal so as to output a third synthesized signal; the third delay unit receives the third synthesized signal and applies thereof so as to output a third delay signal; the fourth gain unit receives the third delay signal and applies thereof so as to output a fourth gain signal; the third signal synthesizer is used to receive and synthesize the audio source signal, the feedback signal and the fourth gain signal so as to output a third synthesized signal; and the fifth gain unit receives the fifth gain signal and applies thereof so as to output a fifth gain signal, which is the reverberation signal.

In addition, the audio source device is acted as a sixth gain unit, which is used to receive the audio source signal and apply thereof so as to output a sixth gain signal, also known as the direct audio source signal.

Yet, the present invention further provides a method for emulating audio effects, comprising the following steps: delaying and decaying an audio source signal for simulating the performance of the audio source signal in a certain environment; mixing the audio source signal with the delayed and decayed audio source signal for simulating a reverberation signal of the audio source signal in the environment, and controlling the mixing signal of the audio source signal and the decayed audio source signal in accordance to the echo signal; synthesizing the audio source signal, the echo signal, and the reverberation signal and employing the resulting synthesized signal as the audio effect of the audio source signal in the certain environment.

In a preferred embodiment of the present invention, in order to simulate dynamic audio effects, before the audio source signal, the echo signal and the reverberation signal are synthesized, the aforesaid three signals are first decayed respectively, moreover, the intensity of the three signals will decay following the progress of time.

Furthermore, in order to make the simulated audio effect more apparent for outputting, the root-mean-square values of the aforesaid three signals are adjusted, such that while synthesizing the three signals, the root-mean-square value of the echo signal is larger than twofold the root-mean-square value of the audio source signal, and also the root-mean-square value of the reverberation signal is larger than twofold the root-mean-square value of the audio source signal.

To sum up, the present invention comes up with an apparatus and method for emulating audio effects, which is capable of achieving best and most diversified audio effects using efficiently composed electronic devices and limited funding.

DETAILED DESCRIPTION OF THE PRESENT INVENTION

The present invention is provided for achieving a better and more diversified audio effects using efficiently composed electronic devices and limited funding. Therefore, the present invention intends to achieve the aforesaid better and more diversified audio effects using lesser electronic devices by way of an architecture that is capable of simultaneously synthesizing an audio signal source, echoes of the audio signal source, and reverberations of the audio signal source.

The objects, spirits and advantages of the preferred embodiments of the present invention will be readily understood by the accompanying drawings and detailed descriptions, wherein:

The concept of the present invention is to provide an architecture that is capable of simultaneously synthesizing an audio signal source, echoes of the audio signal source, and reverberations of the audio signal source. Therefore, the present invention will delay and decay an audio source signal so as to simulate an echo effect of the audio source signal of a certain environment. Furthermore, the present invention will mix the audio source signal and the delayed/decayed audio source signals so as to simulate a reverberation effect of the audio source signal of the certain environment. Finally, the audio effect of the audio source signal of the certain environment is accomplished by synthesizing the audio source signal, the echo effect and the reverberation effect.

Figure 1:
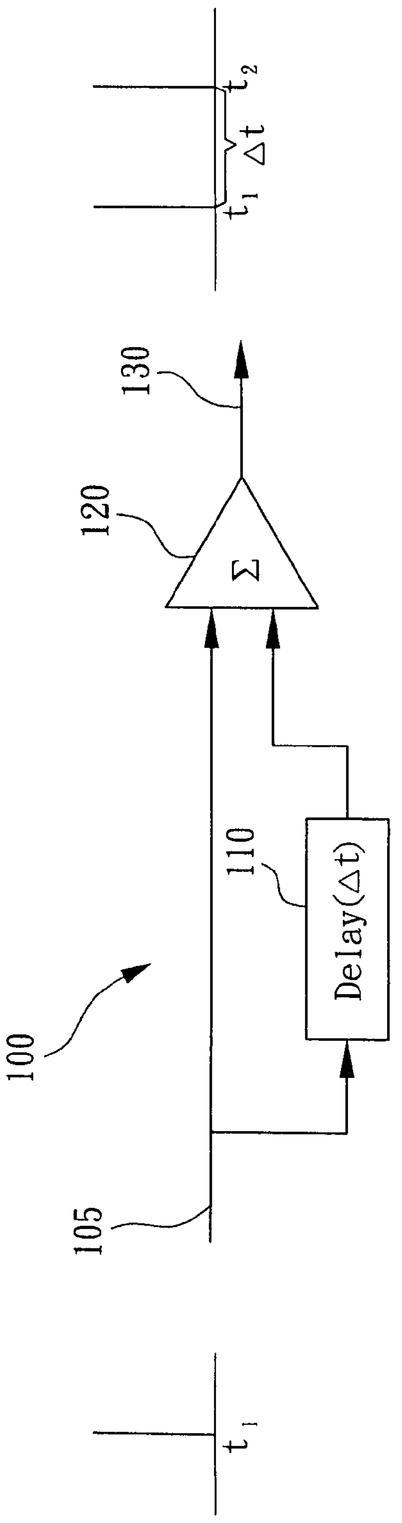
FIG. 1 (PRIOR ART)
FIG. 1 is an illustration schematically showing an echo emulation device of prior arts.
Figure 2:
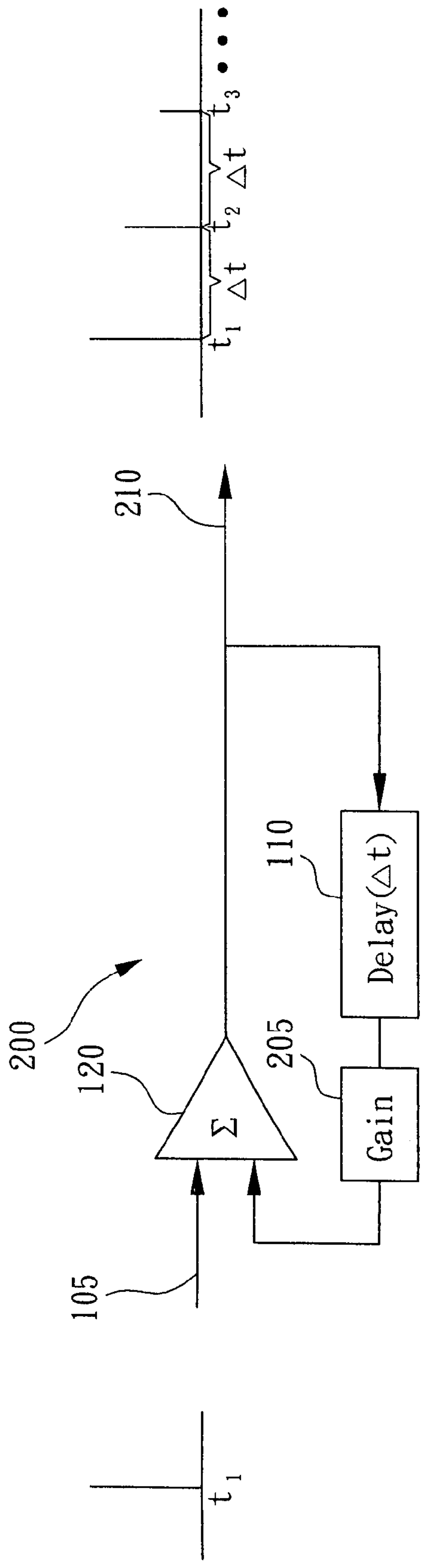
FIG. 2 (PRIOR ART)
FIG. 2 is an illustration schematically showing an reverberation emulation device of prior arts.
Figure 3:
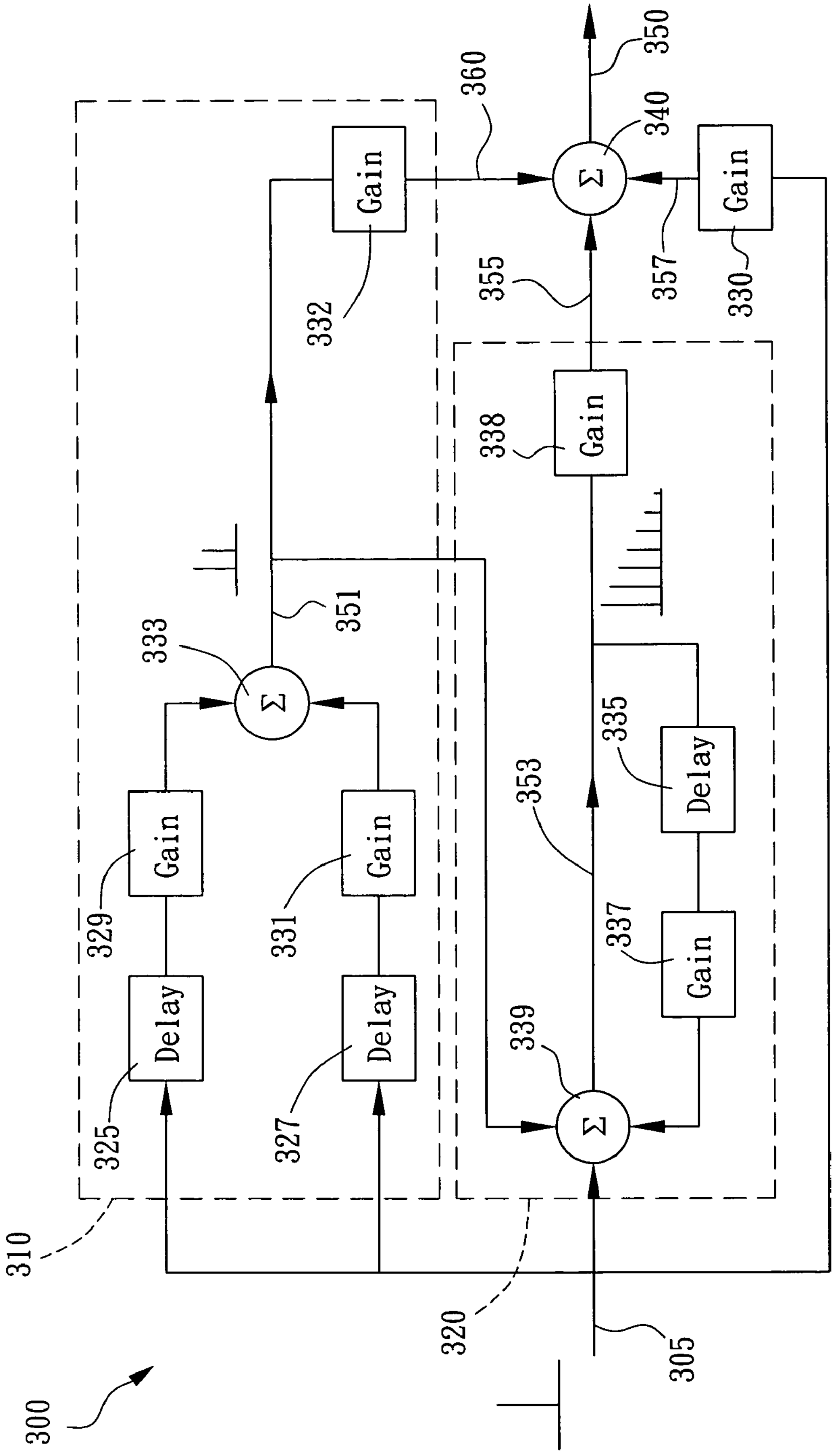
FIG. 3 is an illustration schematically showing a preferred embodiment of an audio effect emulation apparatus according to the present invention.

Please refer to FIG. 3, which is an illustration schematically showing a preferred embodiment of an audio effect emulation apparatus according to the present invention. As seen in FIG. 3, the audio effect emulation apparatus 300 is composed of an echo device 310, reverberation device 320 and audio source device 330 and a signal synthesizer 340. When an audio source signal 305 is received by the audio effect emulation apparatus 300, the audio source signal 305 first will be fed into the echo device 310, the reverberation device 320 and the audio source device 330 respectively for processing, and then the resulting processed signals will be synthesized and outputted by the signal synthesizer 340, moreover, the outputted signal is an audio effect emulation signal 350.

In a preferred embodiment of the present invention, the echo device 310 is composed of delay units 325 and 327, gain units 329 and 332, and a signal synthesizer 333. Furthermore, the reverberation device is composed of a delay unit 335, gain units 337 and 338, and a signal synthesizer 339. As for the audio signal device 330, it can be a gain unit.

In a preferred embodiment of the present invention, the delay units 325,327,335 are mainly used for delaying the audio source signal 305. Thus, the delay units 325,327,335 can be memories or registers capable of storing bytes (usually, in the size of 44 K). The gain units 329, 330, 331, 332, 337, and 338 are mainly used for decaying the audio source signal 305. Thus, the gain units 329, 330, 331, 332, 337, and 338 can be reverse gain units of Z transformation mode. The signal synthesizers 333, 339, 340 are mainly used for adding those of the audio source signals 305 that are delayed and emerging at different delay times. Hence, the signal synthesizers 333, 339, and 340 can be adders.

In this regard, when the audio source signal 305 is received by the audio effect emulation apparatus 300, the audio source signal 305 will be fed into the echo device 310, the reverberation device 320 and the audio source device 330 respectively for processing. The audio source signal 305 being fed into the echo device 320 will further be fed into the delay unit 325 for delaying and the gain unit 329 for decaying in magnitude, the same time, it is also be fed into the delay unit 327 for delaying and the gain unit 331 for decaying in magnitude, thereafter, the resulting two signals are synthesized and outputted by the signal synthesizer 333 as a signal 351. The signal 351 is then fed into the gain unit 332 for decaying in magnitude to be a echo signal 360, the same time, the signal 351 is also being fed into the synthesizer 339 of the reverberation device 320 for controlling the output of the reverberation device 320.

The audio source signal 305 being fed into the reverberation device 320 is then fed into the signal synthesizer 339 for adding the audio source signal 305 and the signal 351 inputted from the echo device 310 so as to output a signal 353, moreover, the signal synthesizer 339 can control the outputting signal 353 according to the feedback generated by delaying the outputting signal 353 using the delay unit 335 and decaying the magnitude of the outputting signal 353 using the gain unit 337. The signal 353 will be a reverberation signal 355 after being decayed in magnitude using the gain unit 338.

Finally, the echo signal 360, the reverberation signal 355 and the direct audio source signal 357 coming respectively from the echo device 310, the reverberation device 320 and the audio source device 330 are synthesized by the signal synthesizer 340 of the audio effect emulation apparatus 300 so as to output a audio effect emulation signal 350.

By adjusting the delaying parameters of the delay units 325, 327, and 335, as well as adjusting the magnitude decaying parameters of the gain units 329, 330, 331, 332, 338, audio effects of different environments can be simulated using the audio effect emulation apparatus 300.

Figure 4:
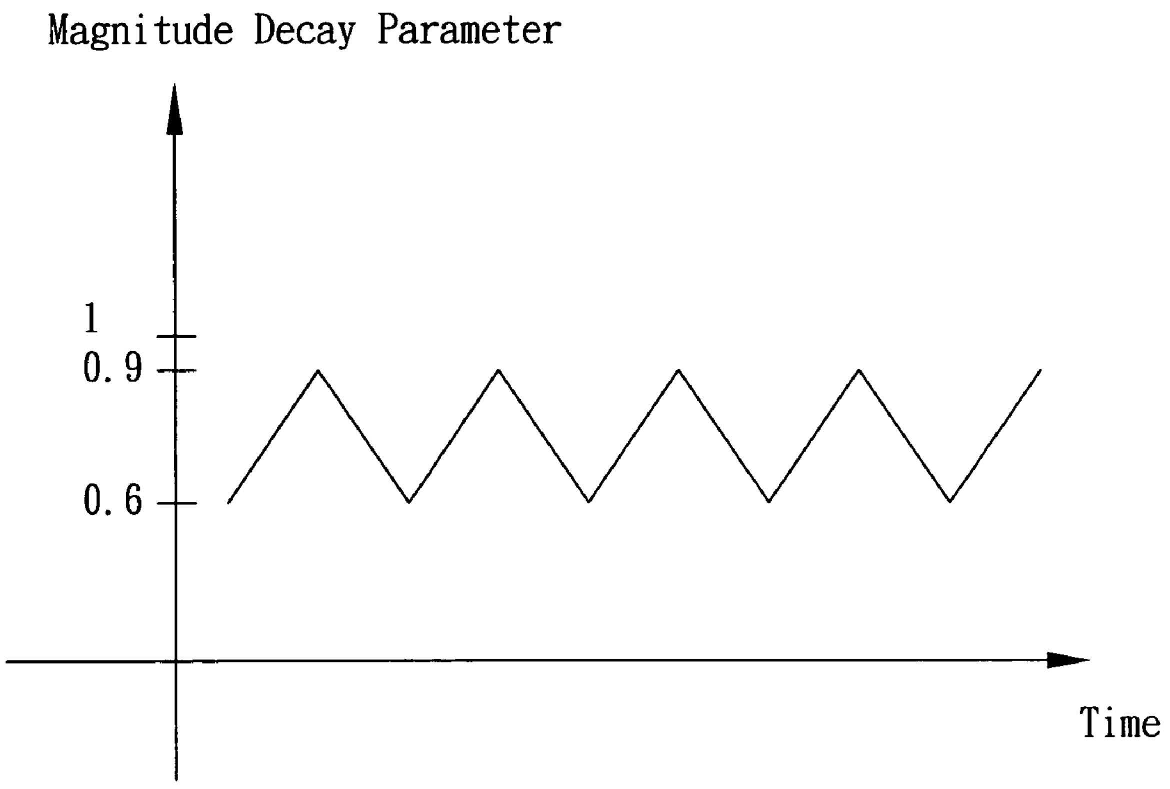
FIG. 4 is a diagram showing the variation of a magnitude parameter in accordance to the change of time.

Please refer to FIG. 4, which is a diagram showing the variation of a magnitude parameter in accordance to the change of time. As seen, the magnitude decay parameters of the gain units 330, 332, and 338 vary along the time and oscillate between 0.6 and 0.9. Therefore, the magnitude of the direct audio signal 357, the echo signal 360, and the reverberation signal 355, respectively coming from the gain units 330, 332, and 338, will also decay along the time. The audio effect emulation signal 350 synthesizing the direct audio signal 357, the echo signal 360 and the reverberation signal 355 will form a dynamic effect that further enriches the audio performance.

In addition, according to experiment, while synthesizing the echo signal 360, the reverberation signal 355 and the direct audio signal 357 in the signal synthesizer 340, the audio effect emulation signal 350 will be optimized if the root-mean-square value of the echo signal 360 is larger than twofold the root-mean-square value of the audio source signal 357, and also the root-mean-square value of the reverberation signal 355 is larger than twofold the root-mean-square value of the audio source signal 357.

Therefore, the best and most diversified audio effects can be achieved by the present invention using only a few electronic devices.

To sum up, the present invention provides a method and an apparatus that applies an architecture capable of simultaneously synthesizing an audio signal source, echoes of the audio signal source, and reverberations of the audio signal source, such that a better and more diversified audio effects using efficiently composed electronic devices can be achieved.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the sprit of the present invention.

What is claimed is:

1. An apparatus for emulating audio effects, receiving an audio source signal so as to simulate and output audio effects of the audio source signal under different environments, comprising: an echo device, receiving the audio source signal and applying thereof so as to generate an echo signal and a feedback signal; a reverberation device, receiving the audio source signal so as to output a reverberation signal according to the feedback signal; an audio source device, receiving the audio source signal and applying thereof so as to output a direct audio source signal; and a first signal synthesizer, receiving and synthesizing the echo signal, the reverberation signal and the direct audio source signal so as to output a first synthesized signal, which is an audio effect emulation signal, wherein the echo device further comprises: a first delay unit, receiving the audio source signal and applying thereof so as to output a first delay signal; a first gain unit, receiving the first delay signal and applying thereof so as to output a first gain signal; a second delay unit, receiving the audio source signal and applying thereof so as to output a second delay signal; a second gain unit, receiving the second delay signal and applying thereof so as to output a second gain signal; a second signal synthesizer, receiving and synthesizing the first gain signal, and the second gain signal so as to output a second synthesized signal, which is the feedback signal; and a third gain synthesizer, receiving the second synthesized signal and applying thereof so as to output a third gain signal, which is the echo signal.

2. The apparatus for emulating audio effects of claim 1, wherein the reverberation device further comprises: a third signal synthesizer, receiving the audio source signal and the feedback signal so as to output a third synthesized signal; a third delay unit, receiving the third synthesized signal and applying thereof so as to output a third delay signal; a fourth gain unit, receiving the second delay signal and applying thereof so as to output a second gain signal, moreover, the third signal synthesizer is used to receive and synthesize the audio source signal, the feedback signal and the fourth gain signal so as to output the third synthesized signal; and a fifth gain unit, receiving the fifth gain signal and applying thereof so as to output a fifth gain signal, which is the reverberation signal.

3. The apparatus for emulating audio effects of claim 2, wherein the audio source device is a sixth gain unit capable of receiving the audio source signal and applying thereof so as to output a sixth gain signal, which is the direct audio source signal.

4. The apparatus for emulating audio effects of claim 3, wherein the first delay unit, the second delay unit and the third unit are registers.

5. The apparatus for emulating audio effects of claim 4, wherein the register is a memory of 44K bytes size.

6. The apparatus for emulating audio effects of claim 5, wherein the first, the second, the third, the fourth, the fifth, and the sixth gain unit are all reverse gain units.

7. The apparatus for emulating audio effects of claim 6, wherein the first, the second and the third signal synthesizer are all adders.

* * * * *